(12) United States Patent
Meyer et al.

(10) Patent No.: US 9,823,393 B2
(45) Date of Patent: Nov. 21, 2017

(54) METALLIZED MULTILAYER STRUCTURE MADE OF SPECIFIC POLYCARBONATES WITH LOW COEFFICIENT OF THERMAL EXPANSION

(71) Applicant: Covestro Deutschland AG, Leverkusen (DE)

(72) Inventors: Alexander Meyer, Düsseldorf (DE); Martin Doebler, Düsseldorf (DE); Ulrich Grosser, Kürten (DE); Rafael Oser, Krefeld (DE); Birte Sämisch, Köln (DE); Thomas Grimm, Pulheim (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

(21) Appl. No.: 14/360,990

(22) PCT Filed: Nov. 23, 2012

(86) PCT No.: PCT/EP2012/073428
§ 371 (c)(1),
(2) Date: May 28, 2014

(87) PCT Pub. No.: WO2013/079398
PCT Pub. Date: Jun. 6, 2013

(65) Prior Publication Data
US 2014/0329071 A1 Nov. 6, 2014

(30) Foreign Application Priority Data
Nov. 30, 2011 (EP) .................................. 11191319

(51) Int. Cl.
*G02B 5/08* (2006.01)
*B29C 45/00* (2006.01)
*B29C 47/08* (2006.01)
*B32B 27/36* (2006.01)
*F21S 8/10* (2006.01)
*C08G 64/14* (2006.01)
*C23C 14/20* (2006.01)
*B32B 15/08* (2006.01)
*B32B 27/20* (2006.01)
*B32B 27/28* (2006.01)
*B29K 69/00* (2006.01)

(52) U.S. Cl.
CPC ........ *G02B 5/0808* (2013.01); *B29C 45/0053* (2013.01); *B29C 47/08* (2013.01); *B32B 15/08* (2013.01); *B32B 27/20* (2013.01); *B32B 27/283* (2013.01); *B32B 27/365* (2013.01); *C08G 64/14* (2013.01); *C23C 14/20* (2013.01); *F21S 48/1394* (2013.01); *B29C 2045/0079* (2013.01); *B29K 2069/00* (2013.01); *B32B 2264/102* (2013.01); *B32B 2264/104* (2013.01); *B32B 2307/308* (2013.01); *B32B 2307/702* (2013.01); *B32B 2457/00* (2013.01); *Y10T 428/24967* (2015.01); *Y10T 428/25* (2015.01); *Y10T 428/252* (2015.01); *Y10T 428/265* (2015.01); *Y10T 428/31507* (2015.04)

(58) Field of Classification Search
USPC ......... 428/215, 412, 323, 325, 336; 264/447
See application file for complete search history.

(56) References Cited

U.S. PATENT DOCUMENTS

| | | | | |
|---|---|---|---|---|
| 4,477,608 | A * | 10/1984 | Babler | C08K 3/04 252/512 |
| 2001/0021731 | A1* | 9/2001 | Kniess | B41M 5/267 523/215 |
| 2004/0063031 | A1 | 4/2004 | Gallucci et al. | |
| 2010/0283001 | A1* | 11/2010 | Pot | C08J 3/20 252/74 |
| 2011/0143126 | A1* | 6/2011 | Meyer et al. | 428/334 |
| 2011/0152418 | A1* | 6/2011 | Eckel | C08L 69/00 524/127 |
| 2012/0129990 | A1* | 5/2012 | Kikuchi et al. | 524/143 |
| 2014/0093712 | A1* | 4/2014 | Tong | C08L 69/00 428/220 |

OTHER PUBLICATIONS

International Search Report received in PCT/EP2012/073428 dated Feb. 28, 2013.
Klaus Horn et al., Polycarbonat (PC), Kunststoffe, Oct. 2005, pp. 90-98, XP00915987.
Anonymous, Headlamp Bezels and Appliance Parts for the Golf A5 in Apec (R), Bayer MaterialScience, Plastics TechCetner, XP002675318, May 2, 2012, 1 page.

* cited by examiner

*Primary Examiner* — Tahseen N Khan
(74) *Attorney, Agent, or Firm* — Drinker Biddle & Reath LLP

(57) ABSTRACT

The invention relates to multilayer structures made of at least one thermoplastic material and having at least one metal layer. The invention further relates to multilayer products encompassing at least three layers comprising a substrate layer made of a substrate comprising specific copolycarbonates and at least one inorganic filler, a metal layer and one or more further layers. The invention further relates to the process for producing the said multilayer structures.

16 Claims, No Drawings

METALLIZED MULTILAYER STRUCTURE MADE OF SPECIFIC POLYCARBONATES WITH LOW COEFFICIENT OF THERMAL EXPANSION

The invention relates to multilayer structures made of at least one thermoplastic material and having at least one metal layer. The invention further relates to multilayer products encompassing at least three layers comprising a substrate layer made of a substrate comprising specific copolycarbonates and at least one inorganic filler, a metal layer and one or more further layers. The invention further relates to the process for producing the said multilayer structures.

Because polycarbonates have high heat resistance they are used inter alia in sectors where relatively high thermal stress is expected. A further increase in heat resistance can be obtained with specific copolycarbonates (e.g. a copolycarbonate based on bisphenol A and bisphenol TMC (1,1-bis(4-hydroxyphenyl)-3,3,5-trimethylcyclohexane)). The said polycarbonates are therefore also suitable for producing lenses, reflectors, lamp covers and lamp housings, etc., exposed to relatively high thermal stress. These applications practically always demand a high level of thermal properties, for example high Vicat softening point (heat resistance)/high glass transition temperature in combination with adequate mechanical properties.

Copolycarbonates made of bisphenol A and bisphenol TMC are available commercially with trademark Apec® from Bayer MaterialScience AG.

The said materials also have to comply with further requirements, for example good surface quality in the resultant injection-moulded part/extrudate, and good metal adhesion, as well as having good processability and good mechanical properties.

Heat resistance and mechanical properties of the copolycarbonates can be varied widely, depending on the bisphenols used and on appropriate adjustment of their molecular weight.

In the reflector applications sector, low thermal expansion is often advantageous, as well as good metal adhesion, since high thermal expansion can have an adverse effect on focusing of light and on light yield. The arrangement mostly has the reflector in the direct environment of the light source, e.g. of an incandescent lamp, which often emits large amounts of heat. The reflector is therefore exposed to high thermal stress—frequently at above 160° C. For this reason it is also necessary to use a material with minimum coefficient of linear thermal expansion. The material is moreover intended to be dimensionally stable in a wide temperature range, in particular even at temperatures above 160° C., i.e. expansion behaviour and shrinkage behaviour must exhibit maximum isotropy, so as to avoid the optical distortions described above during use of the reflector. It is preferable that the expansion behaviour and shrinkage behaviour of the metal layer of the multilayer item are similar to those of the base layer, since otherwise stresses can lead to surface warpage and thus to iridescence. Appropriate adjustment of thermal expansion behaviour therefore mitigates surface defects such as cracking, iridescence and compression.

Reflector covers used nowadays in the automobile sector are frequently flat transparent polycarbonate sheets. This places more stringent requirements on the surface quality of the elements (e.g. reflector, subreflector, frame) which have high external visibility, while other important factors are dimensional stability at elevated temperature, minimized gas evolution, in order to avoid formation of bubbles, mechanical strength, easy processing and low manufacturing tolerances.

The material for the base layer is preferably intended to be injection-mouldable and to be relatively inexpensive in comparison with other thermoplastics with Vicat softening points above 160° C.

As described above, the corresponding metallized parts must have high heat resistance. This means that there must be no impairment of mechanical properties or of optical properties, e.g. the quality of the metal surface. However, it has been found that metallized mouldings made of certain thermoplastics, among which are copolycarbonates, with Vicat softening points above 160° C., in particular above 170° C., and which comprise inter alia 1,1-bis(4-hydroxyphenyl)cyclohexane derivatives often exhibit inadequate optical quality for specific applications at very high temperatures. By way of example, mouldings of this type which have been pretreated and metallized under specific conditions, in particular under plasma conditions, have a tendency to form bubbles (formation of bubbles and cracking in the coating) under specific conditions at high temperatures (in particular at temperatures or temperature peaks above 170° C.). This can cause failure of the corresponding moulding in the respective application. Formation of bubbles causes the metal surface to lose its uniform appearance—and there is moreover an adverse effect on the reflection of light.

Another surprising finding was that not every metallization process leads to damage to the surface under thermal stress. If the metallization process merely applies the corresponding metal from the vapour phase without exposing the substrate to any of the ion bombardment that occurs in low-frequency plasma pretreatment or in DC sputtering, the polymer-metal composite is very stable and, even under thermal stress, develops no surface defects. The surface defects occur when the injection-moulded parts have been coated in the plasma in a DC sputtering process. However, here again it is not every plasma-assisted process that leads to subsequent surface defects. By way of example, a further low-frequency plasma step has to take place, e.g. a plasma pretreatment. In this step, plasma is used to remove contamination from the surface and optionally to activate the polymer for the subsequent application of metal or the deposition of the topcoat. The surface-cleaning and surface-activation effect makes this step indispensible in an industrial process. For economic reasons, the multilayer structure according to the invention is intended to be capable of undergoing coating in a DC sputtering process—a precondition for this is that the substrate material is suitable for this coating method.

As described above, surface defects after thermal stress are especially bubbles, which disrupt the metallic surface. Clouding of a metal surface can also occur after thermal stress. Another defect that can occur is surface iridescence after thermal stress. All of the said defects occur only if the metallized structure is subjected to thermal stress—it is therefore not possible to discern beforehand, i.e. directly after metallization, whether a metallized moulding will develop surface defects.

Production of reflectors has hitherto meant for the most part thermosets; thermoplastics have also been used, but less frequently. Among the latter, the amorphous thermoplastics mainly used, e.g. polyetherimide (PEI), polyamideimide (PAI) or polysulphones, e.g. polyether sulphone (PES)/polysulphone (PSU)/polyphenylene ether sulphone (PPSU), have high to very high Vicat softening point/glass transition temperature (Tg). The said amorphous high-Tg thermoplastics can be used without fillers to produce reflector preforms with excellent surface smoothness. The reflector preforms can be metallized directly. However, a disadvantage for mass production is that the price of the amorphous high-Tg thermoplastics mentioned is sometimes very high. Furthermore, it is sometimes difficult to process these high-Tg thermoplastics. Some of them also have coefficients of thermal expansion which are too high for difficult reflector geometries.

Headlamp reflectors mainly use bulk moulding compounds (BMCs). These involve a semifinished fibre-matrix product. This is mostly composed of short glass fibres and of a polyester resin or vinyl ester resin, but other reinforcing fibres or resin systems can be used. BMC is processed by hot press moulding, permitting short cycle times. For this, the BMC composition is inserted centrally into a heated, divided mould. On closure, the BMC becomes distributed within the mould. By virtue of the short fibre lengths, material can also be provided to thin ribs and thin walls during the pressing process. However, there is a risk of demixing of the BMC at constrictions. This occurs when fibres block a constriction, and only the resin can therefore flow onwards. The individual reinforcing fibres generally become oriented in the direction of flow, and high fibre orientation can therefore occur locally. By using specific methods it is also possible to process BMC in the injection-moulding process, if fibre lengths are appropriately small.

Car headlamps, or more precisely the headlamp reflectors, are a typical application for thermosets (BMCs). Here, good dimensional accuracy and heat resistance are significant. The process is very similar to elastomer injection moulding. The cycle times for thermoset processing are generally longer than for thermoplastics at wall thicknesses up to about 4 mm This mostly places thermosets at a disadvantage in economic comparison with thermoplastics, if there is no need for good electrical or mechanical properties. The metallization of the said thermosets requires further manufacturing steps, e.g. polishing and lacquering, with resultant further economic disadvantage in comparison with directly metallizable thermoplastics.

The role of fillers here is predominantly to reduce the production costs of the BMC, in that less expensive fillers replace volumes of fibre and of resin. Additional substances are added as required by the properties desired, for example increased flame retardancy or low shrinkage. By way of example, magnesium oxide increases plasticity and kaolin increases acid resistance.

The highest temperatures naturally prevail within the lighting unit. The reflectors have therefore hitherto been produced either from sheet metal, from thermosets, such as BMC, or from metallized, injection-moulded amorphous high-Tg thermoplastics (PEI, PSU, PES). The stringent tolerance requirements, coupled with the surface quality that the injection-moulded parts require for metallization, has hitherto mainly been achieved by using unfilled amorphous high-Tg thermoplastics or lacquered thermosets.

Another requirement relates to the surface quality of the (mostly curved) plastics surface to be coated. Specifically in the case of reflectors, where the light yield is an essential factor, a very smooth, high-gloss surface with maximum homogeneity must be provided for the coating. Plastics that have poor flow or that solidify too soon/addition of fillers often lead(s) to rough, matt, or irregular replication in the injection mould, measured against the extremely stringent requirements for a mirror-finish surface, even if the corresponding surface of the shaping mould has a high-gloss polish.

The transparent, colourless and amorphous homopolyamides disclosed in European Patent EP 725 101 B2 have a glass transition temperature of about 157° C. and are, at most, suitable for the production of subreflectors, but are not suitable for producing light-reflector components exposed to higher operating temperatures.

The U.S. Pat. No. 6,355,723 B1 discloses injection-moulded reflectors made of amorphous thermoplastics, such as polyetherimides, polyaryl ethers, polyether sulphones, polysulphones, polycarbonates, polyester carbonates, polyarylates, polyamides, polyesters and single-phase mixtures of these thermoplastics. The said reflectors can be provided directly with a metal layer and have a glass transition temperature (Tg) of at least 170° C. to 200° C. All of the said reflectors have black colouration due to admixture of dyes, so that noticeable surface defects become easier to detect by means of visual inspection prior to metallization of the reflector surface, and so as to suppress undesired optical effects due to non-metallized parts of the reflectors. However, the said materials and mouldings do not have the desired low coefficients of thermal expansion and are in some cases too expensive for the desired application.

A general disadvantage of the polycarbonates/copolycarbonates previously described in the prior art is that, because their coefficients of expansion are excessively high, they can have only limited suitability, or are not at all suitable, for use as metallized component in, for example, high-temperature applications as reflector.

Some polyimides have very high glass transition temperatures in combination with very low coefficients of thermal expansion—but they have orange to brown appearance. These materials are likewise very expensive. A desirable polymer material for reflectors would provide high optical surface quality at acceptable costs, together with high glass transition temperature, and low thermal expansion.

Metals can be applied to the polymer by way of various methods, e.g. application from the vapour phase or sputtering. The processes are described in more detail by way of example in "Vakuumbeschichtung Bd. 1 bis 5" [Vacuum coating, Volumes 1 to 5], H. Frey, VDI-Verlag Düsseldorf 1995 or "Oberflächen- and Dünnschicht-Technologie" [Technology of surfaces and thin layers] Part 1, R. A. Haefer, Springer Verlag 1987.

In order to achieve better metal adhesion and in order to clean the substrate surface, the substrates are normally subjected to a plasma pretreatment. A plasma pretreatment can sometimes alter the surface properties of polymers. These methods have been described by way of example by Friedrich et al. in Metallized Plastics 5&6: Fundamental and applied aspects and H. Grünwald et al. in Surface and Coatings Technology 111 (1999) 287-296.

Further layers, such as corrosion-reducing protective sizes, can be applied in a PECVD (Plasma Enhanced Chemical Vapour Deposition) or plasma polymerization process. Here, low-boiling-point precursors mainly based on siloxane are vaporized into a plasma and thus activated so that they can form a film. Typical substances here are hexamethyldisiloxane (HMDSO), tetramethyldisiloxane, decamethylcyclopentasiloxane, octamethylcyclo-tetrasiloxane and trimethoxymethylsilane.

Copolycarbonates based on cycloalkylidenediphenols are known and have been described in various publications.

By way of example, DE 3 903 103 A1, EP 414 083 A2 and EP 359 953 A1 describe the production and use of polycarbonates based on cycloalkylidenediphenols.

There are also many descriptions of compositions comprising copolycarbonates with cycloalkylidenediphenols, and of various other polymeric components.

However, none of the said applications concerns improved optical properties of metallized mouldings at temperatures above 160° C./above 170° C. Equally, no materials with low coefficient of thermal expansion are described. The prior art does not hitherto reveal how the problem described above can be solved.

It was therefore an object to provide a multilayer structure which has a highly reflective surface and which has a coefficient of linear thermal expansion in accordance with ASTM E831 of less than $58 \times 10^{-6}$/K, preferably less than $55 \times 10^{-6}$/K, particularly preferably less than $53 \times 10^{-6}$/K, very particularly preferably less than $50 \times 10^{-6}$/K (longitudinally and transversely) and which has a surface with a gloss level of at least 800 (20° angle of incidence and angle of reflection), preferably greater than 1000 (20° angle of incidence and angle of reflection), measured in accordance with ASTM D523. The surface here is intended to retain the defect-free, high-gloss properties even at high temperatures over a prolonged period (thermal stability).

The multilayer structure is moreover intended to be composed of a substrate material (base layer) which has high melt stability, since relatively high thermal stresses can occur during the processing of thermoplastics with comparatively high Vicat softening point. The substrate material is moreover intended to be less expensive than commonly used polyetherimide/polysulphone/polyether sulphone. The base layer is moreover intended to exhibit maximum isotropy in relation to thermal expansion. The difference between longitudinal thermal expansion and the corresponding transverse value (or vice versa) is therefore intended to be no more than 25%, preferably no more than 20%, particularly preferably no more than 15%. The base layer here must have high heat resistance, i.e. a glass transition temperature/Vicat softening point above 160° C.

In one particularly preferred embodiment, the reflector is intended to have high thermal conductivity, in order to minimize the thermal stress that often occurs with reflectors by virtue of appropriately high thermal conductivity. In one particular embodiment, thermal conductivity is therefore intended to be more than 0.3 W/mK, preferably more than 0.4 W/mK.

Production of the multilayer structure according to the invention moreover requires that the substrate layer be coated in a specific process in order to obtain the good reflection properties, even at high temperatures.

Furthermore, a corresponding moulding (substrate material; base layer) must be produced in an injection-moulding process/thermoforming process at mould temperatures above 160° C. in order to produce a surface free from local defects. In principle, the methods for producing high-quality surfaces at high mould temperatures are known, but the person skilled in the art does not know which substrate materials are suitable for a process of this type and moreover for the production of metallized multilayer structures.

Surprisingly, the problem was solved by using a substrate material made of specific copolycarbonates in conjunction with specific fillers. It was found here that specific inorganic particles with spherical/lamellar geometry are suitable for achieving the object. Particular preference is given here to substrate materials comprising at least 60% by weight of copolycarbonates based on 1,1-bis(4-hydroxyphenyl)cyclohexane derivatives.

According to the invention, the object is achieved through a multilayer structure composed of the following:

a base layer a)
a metal layer b)
one or more layers c)
optionally one or more further layers.

a) Base layer composed of a copolycarbonate with a Vicat softening point above 160° C. The substrate material here is preferably composed of copolycarbonates with a Vicat softening point above 160° C., preferably above 165° C., with particular preference above 170° C., comprising, as chain terminator (terminal group) a structural unit of the formula (1)

in which
R1 are hydrogen or $C_1$-$C_{18}$-alkyl; very particular preference is given to the following as chain terminator: phenol or tert-butylphenol or n-butylphenol, in particular phenol and p-tert-butylphenol, and comprises at least one diphenol unit of the formula (2),

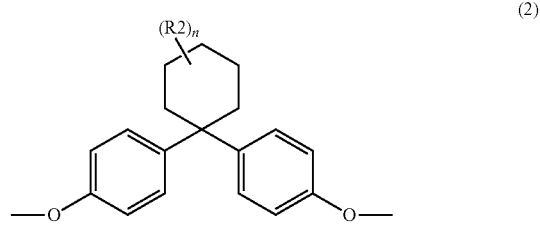

in which
R2 is $C_1$-$C_4$-alkyl (encompassing methyl, ethyl, propyl, isopropyl and butyl, and also isobutyl moieties), preferably methyl,
n is 0, 1, 2 or 3, preferably 2 or 3, and also comprises one or more inorganic fillers with spherical or lamellar geometry in an amount of from 5 to 50% by weight, preferably from 10% by weight to 40% by weight, with particular preference from 15% by weight to 35% by weight, based on the entirety of thermoplastics used, of; the thickness of the layer a) here is from 0.1 mm to 6.0 mm, preferably from 0.2 mm to 5.0 mm and particularly preferably from 0.5 mm to 4.0 mm b) A metal layer made of aluminium, silver, chromium, titanium, or palladium, preferably of silver or aluminium, with particular preference aluminium where the thickness of the metal layer is preferably from 10 nm to 1000 nm, preferably from 50 nm to 800 nm, with particular preference from 60 nm to 500 nm and very particularly preferably from 60 nm to 300 nm It is preferable that the said metal layer is produced in a plasma process, and c) optionally a protective layer (hereinafter also termed topcoat) made of polysiloxane preferably produced in a plasma process with hexamethyldisiloxane (CAS 107-46-0) as coating material. The layer thickness of the topcoat is from 10 nm to 200 nm, preferably from 20 nm to 100 nm.

In another specific embodiment, there may moreover also be a layer present which inhibits formation of condensate on the surface.

The metallization process encompasses three steps:
1. Plasma pretreatment
2. Metallization
3. Deposition of a corrosion-protection layer.

The metal layer is typically applied from the vapour phase or DC-sputtered (cathode atomization by way of direct-voltage plasma). The same technical equipment is typically used for step 1 and 3. This is also prior art.

Examples of preferred diphenol units of the formula (2) are 1,1-bis(4-hydroxy-phenyl)cyclohexane and 1,1-bis(4-hydroxyphenyl)-3,3,5-trimethylcyclohexane, preferably 1,1-bis(4-hydroxyphenyl)-3,3,5-trimethylcyclohexane.

Preference is given here to copolycarbonates which comprise, based on the entirety of the bisphenol components, from 15% by weight to 95% by weight, in particular from 25% by weight to 90% by weight, of diphenol units of the formula (2).

Apart from the diphenols of the formula (2), suitable dihydroxyaryl compounds for producing the copolycarbonates are those of the formula (3)

HO—Z—OH  (3)

in which
Z is an aromatic moiety which has from 6 to 30 carbon atoms and which can comprise one or more aromatic rings, can have substitution, and can comprise aliphatic or cycloaliphatic moieties/alkylaryl systems or heteroatoms as bridging components.

It is preferable that Z in formula (3) is a moiety of the formula (3a)

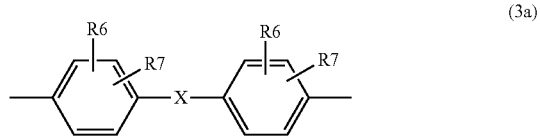

(3a)

in which
R6 and R7 are mutually independently H, $C_1$-$C_{18}$-alkyl, $C_1$-$C_{18}$-alkoxy, halogen such as Cl or Br, or are respectively optionally substituted aryl or aralkyl, preferably are H or $C_1$-$C_{12}$-alkyl, particularly preferably are H or $C_1$-$C_8$-alkyl and very particularly preferably are H or methyl, and
X is —CO—, —O—, —S—, C1-C6-alkylene, $C_2$-$C_5$-alkylidene or are $C_6$-$C_{12}$-arylene, which optionally can have been condensed with further aromatic rings comprising heteroatoms.

It is preferable that X is $C_1$-$C_5$-alkylene, $C_2$-$C_5$-alkylidene, —O—, —SO—, —CO—, —S—, —$SO_2$—, isopropylidene or oxygen, in particular isopropylidene.

Examples of diphenols of the formula (3) that are suitable for producing the copolycarbonates to be used according to the invention are hydroquinone, resorcinol,
bis(hydroxyphenyl)alkanes, bis(hydroxyphenyl)sulphides, bis(hydroxyphenyl)ethers, bis(hydroxyphenyl)ketones, bis(hydroxyphenyl)sulphones, bis(hydroxyphenyl)sulphoxides, [alpha],[alpha]'-bis(hydroxyphenyl)diisopropylbenzenes, and also (ring-)alkylated and ring-halogenated derivatives thereof.

Diphenols of the formula (3) to which further preference is given are 4,4'-dihydroxydiphenyl, 2,2-bis(4-hydroxyphenyl)-1-phenylpropane, 1,1-bis(4-hydroxyphenyl)phenylethane, 2,2-bis-(4-hydroxyphenyl)propane, 2,2-bis(3-methyl-4-hydroxyphenyl)propane, 2,4-bis(4-hydroxy-phenyl)-2-methylbutane, 1,3-bis[2-(4-hydroxyphenyl)-2-propyl]benzene (bisphenol M), 2,2-bis(3-methyl-4-hydroxyphenyl)propane, bis(3,5-dimethyl-4-hydroxyphenyl)methane, 2,2-bis(3,5-dimethyl-4-hydroxyphenyl)propane, bis(3,5-dimethyl-4-hydroxyphenyl) sulphone, 2,4-bis(3,5-dimethyl-4-hydroxyphenyl)-2-methylbutane, 1,3-bis[2-(3,5-dimethyl-4-hydroxy-phenyl)-2-propyl]benzene.

Particularly preferred diphenols of the formula (3) are 2,2-bis(4-hydroxyphenyl)propane (BPA), and 2,2-bis(3-methyl-4-hydroxyphenyl)propane.

Preference is particularly given to copolycarbonates made of bisphenol A and bisphenol TMC.

These and other suitable diphenols are available commercially and are described by way of example in "H. Schnell, Chemistry and Physics of Polycarbonates, Interscience Publishers, New York 1964, pp. 28 ff; pp. 102 ff", and in "D. G. Legrand, J. T. Bendier, Handbook of Polycarbonate Science and Technology, Marcel Dekker New York 2000, pp. 72 ff.".

Particular preference is given to random copolycarbonates.

The molar masses Mw (weight-average Mw, determined by gel permeation chromatography GPC measurement) of the thermoplastic copolycarbonates are from 12 000 to 120 000, preferably from 15 000 to 80 000, in particular from 18 000 to 60 000, very particularly preferably from 18 000 to 40 000, g/mol. It is also possible to use the number average Mn to state molar masses, and these are likewise determined by means of GPC after prior calibration on polycarbonate.

The base layer here comprises from 5% by weight to 50% by weight, preferably from 10% by weight to 40% by weight, with particular preference from 15% by weight to 35% by weight, based on the entirety of thermoplastics used, of inorganic fillers with spherical or lamellar geometry. Preference is given to the fillers with spherical or lamellar geometry in fine-particle and/or porous form with large exterior and/or interior surface area. Lamellar means in this context flat structures with a large difference in the three dimensions—by way of example, therefore, the value for the thickness is markedly smaller than the length/width of the particle. The quotient derived from length/diameter is also termed aspect ratio. For the present invention, suitable particles here have an aspect ratio of from 1000:1 to 10:1. Materials involved here are preferably thermally inert and inorganic, in particular based on nitrides, such as boron nitride, or involve oxides or mixed oxides, or involve carbides, such as tungsten carbide or boron carbide, powdered quartz, $SiO_2$ particles, such as nanoparticles, amorphous $SiO_2$, ground sand, glass particles, such as glass powder, in particular glass beads, or graphite, in particular high-purity synthetic graphite. Preference is given here in particular to quartz and synthetic graphite.

The graphite that can be used in the present invention can be electrically conductive. The graphite is preferably one selected from a synthetic or natural graphite. Synthetic graphite is particularly preferred. The shape of the graphite particles can be lamellar or spherical or the graphite can comprise a mixture of the said particle shapes. The graphite is preferably lamellar. Lamellar means in this context flat structures with a large difference in the three dimensions—by way of example, therefore, the value for the thickness is markedly smaller than the length/width of the particle. The lamellae can be composed of one graphite layer or of a plurality of close-packed layers. The smallest dimension (thickness) here is less than 1 μm, preferably less than 500 nm and most preferably less than 200 nm, and at least 0.4 nm, preferably 1 nm, where the aspect ratio is in the range from 1000:1 to 10:1. The benefit according to the invention can be obtained even if some of the lamellar particles do not have a uniformly flat shape. By virtue of the low thickness of the particles, these can have a curved shape or can have other deformities. The thickness of the particles can be determined by standard methods, e.g. transmission electron microscopy.

The graphite can comprise individual graphite particles or aggregates or agglomerates of graphite particles. The median particle size (d90%) of the particles, aggregates or agglomerates is preferably from 1 to 160 µm, more preferably from 5 to 100 µm and with further preference from 10 to 60 µm. In another embodiment, the ashing residue of the graphite is smaller than 0.5%, preferably smaller than 0.1% by weight, measured in accordance with ASTM D1506. In another embodiment, the moisture level of the graphite is smaller than 0.5%, measured in accordance with ASTM D1509-95. The BET surface area of the graphite is preferably at least 5 m$^2$/g, with particular preference at least 8 m$^2$/g. The BET surface area is determined in accordance with ASTM D3037.

The graphite is produced by a well-known graphitization process. The starting materials here are by way of example brown coal, petroleum and pitch, or else plastics. Heating with exclusion of air to about 3000° C. during graphitization also converts amorphous carbon to polycrystalline graphite.

The graphite is used in solid form. Commercially available graphite for applications involving pressure can be used, for example that obtainable from TIMCAL AG, CH-6743 Bodio, Switzerland, preferably with the name TIMREX KS44 or TIMREX KS150, KS 75, KS 5-75TT, KS 5-44, KS 6, with particular preference KS 44.

If glass beads are used, these are preferably used in the form of glass beads/glass microbeads (or round glass spheres or microspheres) with a diameter of from 4 µm to 120 µm. The glass beads used are available commercially—examples being products from Potters Europe), and they are traded by way of example as Spheriglass 5000, with a diameter of from 4 µm to 25 µm, Spheriglass 3000, with a diameter of from 12 µm to 48 µm, and Spheriglass 2429, with a diameter of from 53 µm to 106 µm. The smaller the glass beads, the greater their number and surface area per unit of weight. The shape of the grains here is approximately spherical. It is preferable that solid glass beads are involved, and not hollow glass beads.

However, other similar materials are also suitable, for example porcelain beads. A factor to be taken into account here is that it is particularly preferable for the purposes according to the invention to use glass beads made of borosilicate glass (E glass). A glass (soda-lime glass) is unsuitable for the present invention because of the stringent thermal requirements.

In another embodiment it is preferable to use inorganic fillers whose structure is based to an extent of more than 97% by weight on quartz ($SiO_2$). The shape of the grains here is approximately spherical.

In a preferred embodiment, fine-particle powdered quartz is involved here, produced from treated quartz sand via iron-free grinding with subsequent pneumatic sieving.

Particular preference is given to quartz particles with a D50% particle size of from 0.1 µm to 100 µm, preferably from 1 µm to 50 µm and very particularly preferably from 1 µm to 5 µm, and with a D98% value of from 1 µm to 100 µm, preferably from 5 µm to 50 µm. It is preferable that the specific BET surface area of the quartz particles, determined by nitrogen adsorption in accordance with ISO 9277 is from 0.5 to 10 m$^2$/g. The particles can optionally be coated particles, and it is preferable here to use epoxysilane sizes, methylsiloxane sizes, and methacrylic silane sizes.

Examples of suitable commercially available products are Sikron SF 500 and Sikron SF 800 from Quarzwerke GmbH (50226 Frechen, Germany).

It is also possible to use a mixture of various fillers.

An entirely surprising fact was that comparable spherical or lamellar fillers based on other compositions than those mentioned according to the invention are not suitable for the substrate material described. By way of example, it has been shown that phyllosilicates such as clays, talcs or kaolin are unsuitable for the purposes of the invention. Glass fibres, where these can be used to reduce coefficient of thermal expansion, are also unsuitable. For the purposes of the invention, therefore, suitable materials are only a very small portion of the starting materials which could theoretically be used to reduce the coefficient of thermal expansion. These fillers had not previously been identified, and nor could the person skilled in the art derive their identity from the prior art.

The said layer is preferably produced in an injection-moulding process or thermoforming process with mould temperatures similar to or above the Vicat softening point of the substrate material used.

In another embodiment, further polymers based on polysulphone, polyether sulphone or polyetherimide are admixed with the copolycarbonate of the substrate layer a). The polycarbonate content in the mixture here, based on the entirety of thermoplastics used, is preferably more than 50% by weight, particularly preferably more than 60% by weight and with particular preference more than 70% by weight. Preference is given by way of example to what are known as polyether sulphones (CAS: 25608-63-3) which are obtainable by way of example with trade mark Ultrason® E 2010 from BASF SE (67056 Ludwigshafen, Germany). Preference is further given to what are known as polyphenyl sulphones (CAS 25608-64-4)—these are obtainable with trade mark Radel® R (e.g. Radel® R 5900) from Solvay Advanced Polymers, or Ultrason® P from BASF SE (67056 Ludwigshafen, Germany). Polyetherimides are known by way of example with trade mark Ultem® (CAS 61128-46-9) (Sabic Innovative Plastics).

Mixtures of the abovementioned polymers can also be used.

In one preferred embodiment, the layer b) bears a protective layer c) composed of plasma-polymerized siloxanes of thickness from 5 nm to 200 nm, preferably from 15 nm to 150 nm and very particularly preferably from 20 nm to 100 nm.

In another specific embodiment, a layer d) can moreover be present, inhibiting formation of condensate on the surface.

The multilayer structures according to the invention have significantly improved thermal properties (Vicat softening point) in conjunction with good metallizability. Surface quality is retained even under high thermal stress. Mechanical, thermal and rheological properties here remain unaltered when a comparison is made with standard copolycarbonates (e.g. Apec). They moreover have the required low coefficients of linear thermal expansion. The substrate material moreover has high melt stability.

The polymer composition of the substrate material can comprise low-molecular-weight additives. However, it is preferable to minimize amounts of additives used. In one embodiment, the polymer composition comprises no low-molecular-weight additives—with the express exception of fillers here.

A preferred heat stabilizer is tris(2,4-di-tert-butylphenyl) phosphite (Irgafos 168), tetrakis(2,4-di-tert-butylphenyl) [1,1-biphenyl]-4,4'-diylbisphosphonite, trisoctyl phosphate, octadecyl 3-(3,5-di-tert-butyl-4-hydroxyphenyl)propionate (Irganox 1076), bis(2,4-dicumyl-phenyl)pentaerythritol diphosphite (Doverphos S-9228), bis(2,6-di-tert-butyl-4-methyl-phenyl)pentaerythritol diphosphite (ADK STAB PEP-36). They are used alone or in a mixture (e.g. Irganox B900 or Doverphos S-9228 with Irganox B900/Irganox 1076). One particularly preferred embodiment uses no heat stabilizer.

A preferred mould-release agent is pentaerythritol tetrastearate, glycerol monostearate, stearyl stearate or propanediol mono/distearate. These are used alone or in a mixture. One particular embodiment uses no mould-release agent. Preferred UV stabilizers are 2-(2'-hydroxy-phenyl) benzotriazoles, 2-hydroxybenzophenones, esters of substituted and unsubstituted benzoic acids, acrylates, sterically hindered amines, oxamides, and 2-(2-hydroxy-phenyl)-1,3, 5-triazines, and particular preference is given to substituted benzotriazoles such as Tinuvin 360, Tinuvin 350, Tinuvin 234, Tinuvin 329 or UV CGX 006 (Ciba). One particular embodiment uses no UV absorber.

It is moreover possible to use colorants, such as organic dyes or pigments or inorganic pigments, or IR absorbers, individually, in a mixture, or else in combination with processing aids. The composition according to the invention here is preferably free from titanium dioxide.

The composition can comprise further commercially available polymer additives, such as flame retardants, flame retardant synergists, antidrip agents (for example compounds from the substance classes of the fluorinated polyolefins and of the silicones), nucleating agents, antistatic agents, such as polyalkylene ethers, alkylsulphonates or polyamide-containing polymers), in amounts which do not impair the mechanical properties of the composition to the extent that compliance with the targeted property profile is no longer achieved.

A non-limiting description of examples of suitable additives is found in "Additives for Plastics Handbook, John Murphy, Elsevier, Oxford 1999", and in "Plastics Additives Handbook, Hans Zweifel, Hanser, Munich, 2001" or in WO 99/55772, pp. 15-25.

The thermoplastic moulding compositions needed for the substrate material of the multilayer structure according to the invention are produced by mixing the respective constituents in a known manner and subjecting them to compounding in the melt and extrusion in the melt (mixing in the melt) at temperatures of from 200° C. to 380° C., preferably from 240 to 350° C., in conventional assemblies, such as internal mixers, extruders and twin-screw systems.

The polymer compositions are in particular used for producing components in which optical, thermal and mechanic properties are utilized, as by way of example is the case with housings, articles in the electrical and electronics sector, sheets, lamp holders, lamp covers, and in the automobile sector, examples being lamp holders and lamp covers, light-collector systems and light reflectors—in particular in the photovoltaic sector, collimators, light-emitting diodes, metallized displays and windshields; lens holders, optical-waveguide elements, and in the case of LED applications (sockets, reflectors, heat sinks); automobile parts such as head lamps, bezels, indicators, reflectors and other applications.

The extrudates and mouldings/moulded parts made of the polymers according to the invention are likewise provided by the present application.

The copolycarbonates for producing the layer a) are produced by a continuous interfacial process. The copolycarbonates to be used according to the invention are in principle produced in a known manner from diphenols, carbonic acid derivatives and optionally branching agents.

The process for polycarbonate synthesis is in general terms known and described in numerous publications. EP 517 044 A1, WO 2006/072344 A1, EP 1 609 818 A1 and WO 2006/072344 A1 and citations therein describe by way of example the interfacial process and the melt process for producing polycarbonate.

The diphenols used, and this also applies to all the other chemicals and auxiliaries added to the synthesis, can have contamination by the contaminants deriving from their own synthesis, handling and storage. However, it is desirable to use raw materials of maximum purity.

The synthesis of the copolycarbonates is conducted continuously. The reaction can therefore take place in pumped-circulation reactors, tubular reactors, or stirred-tank cascades or in a combination of these, and the mixing units previously mentioned are to be used here in order to ensure that demixing of the aqueous and organic phase is as far as possible delayed until the synthesis mixture has completed its reaction, i.e. no longer comprises any saponifiable chlorine in phosgene or in chlorocarbonic esters.

The amount of chain terminator to be used is from 0.5 mol % to 10 mol %, preferably from 1 mol % to 8 mol %, particularly preferably from 2 mol % to 6 mol %, based on moles of respective diphenols used. The chain terminator can be added prior to, during or after phosgenation, preferably taking the form of solution in a solvent mixture of methylene chloride and chlorobenzene (of strength from 8-15% by weight).

The production of the moulded part from the substrate material for producing the multilayer structure according to the invention preferably takes place by the injection-moulding process, where the mould temperature has been set to an order of magnitude similar to that of the Vicat softening point of the substrate material used—see below. The process known as dynamic mould-temperature control is characterized in that the mould wall is rapidly heated prior to the injection of the melt. The elevated mould temperature, which is ideally close to the Vicat point or higher than the Vicat point of the substrate material used, inhibits premature solidification of the melt, thus permitting inter alia higher precision of replication of the mould surface and improving the quality of the component surface. Surprisingly, another consequence of this is that the filler structures present in the substrate material become oriented in such a way as to achieve high surface gloss. The temperature of the mould wall should be in the range of the Vicat point +/−20° C. (i.e. with an upward or downward deviation of 20° C.), preferably in the range +/−10° C., particularly preferably in the range from +3° C. to +7° C. above the Vicat point. Dynamic mould-temperature control is also characterized in that the temperature of the mould wall is reduced at maximum rate back to the original temperature following the injection process and the component cools down to the demoulding temperature in the usual way in the mould. Dynamic mould-temperature control with the aid of induction heating is particularly suitable for manufacturing the components mentioned.

The metallization of layer a) preferably takes place in a DC sputtering process.

Surprisingly, it has been found that a particular process with particular process parameters leads to stable metal layers. By way of example, it has been shown that the combination of particular pressures and particular power ratings during the pretreatment leads to better results. Surprisingly, lower energies cause development of defects in the subsequent metal layer on heat treatment. This was unexpected. However, general metal adhesion can also be achieved with low pretreatment energies. However, metal adhesion can by way of example be tested by a peel test (adhesive-tape-peel test). Blistering (development of bubble-like local defects) after heat treatment can only be inhibited by the process according to the invention. The following steps are therefore preferably used to produce the multilayer structure according to the invention:

A) Production of the base layer a) by processes described above.

B) Pretreatment of the resultant moulded part (base layer) comprising a substrate material made of a copolycarbonate, preferably a copolycarbonate with a proportion by weight, based on the entirety of the bisphenol components, of from 15% by weight to 95% by weight, with particular preference from 25% by weight to 90% by weight, of 1,1-bis(4-hydroxy-phenyl)-3,3,5-trimethylcyclohexane in a diode arrangement with medium-frequency excitation with an air- or argon-based plasma, preferably argon, at a frequency of from 0 Hz to 10 MHz, preferably from 0 Hz to 1 MHz, very particularly preferably from 0 Hz to 100 KHz, a power rating of from 0.4 W/cm$^2$ to 8.4 W/cm$^2$, preferably from 0.5 W/cm$^2$ to 5.0 W/cm$^2$, with particular preference from 0.8 W/cm$^2$ to 3.3 W/cm$^2$, and a process gas pressure of from 0.04 to 0.2 mbar, preferably from 0.05 to 0.16 mbar. Process gases are air, $N_2$, $N_2O$, Ar, He, $O_2$, preferably air or argon, particularly preferably argon. The treatment time is from 10 seconds to 1000 seconds, preferably from 30 seconds to 500 seconds, and with particular preference from 30 seconds to 180 seconds.

C) Metallization of the moulding part in a sputtering process in a DC magnetron in an argon plasma at a pressure of $5 \times 10^{-3}$ mbar starting from aluminium, silver, chromium, titanium, or palladium, preferably from silver or aluminium, with particular preference aluminium, with a process time of from 10 seconds to 1000 seconds.

The thickness of the metal layer is preferably from 10 nm to 1000 nm, preferably from 50 nm to 800 nm, with particular preference from 60 nm to 500 nm, and very particularly preferably from 60 nm to 300 nm.

D) Application of a protective layer (hereinafter also termed topcoat) by the technical equipment described under B). This takes place at a pressure of from 0.01 to 0.30 mbar, preferably using HMDSO (hexamethyldisiloxane; CAS 107-46-0) as coating material with a process time of from 10 seconds to 1000 seconds, preferably from 20 seconds to 500 seconds. The layer thickness of the topcoat is from 10 nm to 200 nm, preferably from 20 nm to 100 nm The power rating used is from 100 W to 5000 W.

EXAMPLES

The invention is described in more detail below on the basis of inventive examples, and the determination methods described here are used for all of the corresponding variables in the present invention unless otherwise described.

Melt volume rate (MVR) is determined in accordance with ISO 1133 under the conditions stated below.
Materials:

Substrate Material 1 (for Comparative Example)

Copolycarbonate comprising 70% by weight of 1,1-bis(4-hydroxyphenyl)-3,3,5-trimethylcyclohexane and 30% by weight of bisphenol A with phenol as chain terminator and MVR 8 cm$^3$/(10 min) (330° C.; 2.16 kg) in accordance with ISO 1133. The Vicat softening point of the material is 208° C. (ISO 306; 50 N; 120 K/h).

Substrate Material 2 (for Multilayer Structure According to the Invention)

Copolycarbonate comprising 70% by weight of 1,1-bis(4-hydroxyphenyl)-3,3,5-trimethylcyclohexane and 30% by weight of bisphenol A with phenol as chain terminator and MVR 8 cm$^3$/(10 min) (330° C.; 2.16 kg) in accordance with ISO 1133 is compounded with 20% by weight of graphite (Timrex KS 44 from Timcal AG, CH-6743 Bodio, Switzerland) under conditions described below. The Vicat softening point of the resultant material is 203° C. (ISO 306; 50 N; 120 K/h).

Substrate Material 3 (for Comparative Example)

Copolycarbonate comprising 70% by weight of 1,1-bis(4-hydroxyphenyl)-3,3,5-trimethylcyclohexane and 30% by weight of bisphenol A with phenol as chain terminator and MVR 8 cm$^3$/(10 min) (330° C.; 2.16 kg) in accordance with ISO 1133 is compounded with 20% by weight of talc powder (Finntalc M05SL-AW from Mondo Minerals B.V.; NL-1041 Amsterdam) under conditions described below. The Vicat softening point of the resultant material is 198° C. (ISO 306; 50 N; 120 K/h).

Compounding

The materials were compounded in a ZE25 twin-screw extruder from KraussMaffei Berstorff, at a barrel temperature of 320° C./a melt temperature of about 340° C. and a rotation rate of 100 rpm, with the amounts stated in the examples of components.

Production of Test Specimens:

To produce moulded parts (rectangular sample sheets with side gating in optical quality with thickness 2 mm) used in Examples 1 and 2 for metallization, dynamic mould-temperature control was used. The injection-moulding process used a Battenfeld HM 210 at a melt temperature of about 350° C. and a mould temperature of about 201° C. The granulated material was dried for 5 hours in a vacuum drying oven at 120° C. prior to processing. Substrate material used comprises Substrate material 2.

Measurement of Heat Resistance by Way of Vicat Softening Point:

Vicat softening point in accordance with DIN EN ISO 306 is measured with a needle (with circular area of 1 mm$^2$) A test force of 50 N (test force B) is applied to the needle. The abovementioned test specimen is exposed to a defined heating rate of 120 K/h. The Vicat point has been reached when the penetration depth of the probe is 1 mm This is measured in accordance with DIN ISO 306.

Gloss Measurement:

Gloss was measured in accordance with ASTM D523 on metallized sample sheets at various angles of incidence in BYK haze-gloss equipment.

Measurement of Thermal Expansion:

Longitudinal coefficients of expansion are determined under nitrogen by using Mettler TMA 841 measurement equipment (measurement range from 23 to 55° C.). ASTM E831 is used as standard.

The test specimens (rectangular sample sheet) needed for the measurement are produced by injection moulding after drying of the granulated material at 130° C. overnight. In each case, the test specimen is measured transversely and longitudinally.

Melt Stability

Melt stability is evaluated by measuring melt volume rate (MVR) after various preheating times.

Metallization Process:

All of the sheets were stored for 21 days for 50% humidity and 23° C. prior to coating.

The coating system was composed of a vacuum chamber, where the specimens were positioned on a rotating specimen holder. The specimen holder rotated at about 20 rpm. Before the test specimens were introduced into the vacuum chamber, ionized air was blown onto them in order to free them from dust. The vacuum chamber with the specimen was then evacuated to a pressure $p \leq 1 \cdot 10^{-5}$ mbar. Argon gas was then allowed to enter until a particular pressure described in the inventive examples (process pressure 1) was reached, and for 2 minutes a plasma was ignited at a certain power rating described in the inventive examples (process power rating 1), and the specimens were exposed to the said plasma (plasma pretreatment). A diode arrangement composed of two parallel metal electrodes was used as plasma source and was operated at an AC frequency of 40 kHz and with a voltage greater than 1000 V. The specimens were then metallized. For this, Ar gas was allowed to enter with a pressure of $5 \cdot 10^{-3}$ mbar. An aluminium layer of thickness about 100 nm was applied to the specimens by means of a DC magnetron, using a power density of 6.4 W/cm$^2$. The sputtering time was 2.5 minutes. Plasma polymerization was then used to apply a corrosion-protection layer made of HMDSO (hexamethyldisiloxane; CAS 107-46-0). For this, HMDSO was vaporized, and the vapour was allowed to enter the vacuum chamber until the resultant pressure of about 0.04 mbar. A plasma was then ignited by the diode arrangement described above at 1500 W for 1 minute, the corrosion-protection layer was applied.

Test for Surface Quality after Heat-Ageing:

The test is carried out directly after metallization. This means that after metallization the sheets were subjected to the said test within one hour.

The metallized sheets here are stored in a conditioning chamber for 2 hours at 45° C. and 100% relative humidity. Directly after conditioning, the sheets are aged for one hour in an oven at 170/180° C.

The metal surface is then assessed.

Visual Assessment:

The surface is studied to reveal elevations in the form of bubbles, clouding of the metal layer, or iridescence. Sheets exhibiting no iridescence, no clouding, and no bubbles are characterized as "defect free".

Example 1

According to the Invention

Rectangular injection-moulded sheets of Substrate material 2 component are prepared as described above.

The test specimens were then metallized as described above. Process pressure 1 here is 0.09 mbar and process power rating 1 is 1.67 W/cm$^2$. All of the other parameters for producing the metal layer/producing the topcoat are set as described above.

Table 1 shows the result of the test (heat ageing).

Example 2

Comparative Example

Rectangular injection-moulded sheets of Substrate material 2 component are prepared as described above.

The test specimens were then metallized as described above. Process pressure 1 here is 0.09 mbar and process power rating 1 is 0.17 W/cm$^2$. All of the other parameters for producing the metal layer/producing the topcoat are set as described above.

Table 1 shows the result of the test (heat ageing).

TABLE 1

| Ex. | Substrate | Pretreatment Sputter process | Heat-ageing temperature | Visual assessment |
|---|---|---|---|---|
| 1 According to the invention | Substrate material 2 | Process power rating 1: 1.67 W/cm$^2$ Process pressure 1: 0.09 mbar | 170° C. | Defect-free |
| 1 According to the invention | Substrate material 2 | Process power rating 1: 1.67 W/cm$^2$ Process pressure 1: 0.09 mbar | 180° C. | Defect-free |
| 2 Comparison | Substrate material 2 | Process power rating 1: 0.17 W/cm$^2$ Process pressure 1: 0.09 mbar | 170° C. | Bubbles |
| 2 Comparison | Substrate material 2 | Process power rating 1: 0.17 W/cm$^2$ Process pressure 1: 0.09 mbar | 180° C. | Bubbles |

Example 1 according to the invention shows that very good surface qualities can be obtained at specific pressures and specific sputter energies. In contrast, there are metallization conditions which lead to defects in the surface in a subsequent stress test.

Example 3

Comparison

Substrate material 2 is processed under conventional conditions to give sample sheets—no dynamic mould-temperature control is used here, i.e. sample sheets are prepared in optical quality, with side-gating. The melt temperature was from 300 to 330° C. and the mould temperature was 100° C. The granulated material was dried at 120° C. for 5 hours in a vacuum drying oven, prior to processing.

The moulded part was then metallized as described in Example 1.

TABLE 2

| | Gloss measurement | |
|---|---|---|
| Example | Gloss at 20° | Gloss at 60° |
| 1 (According to the invention) | 1449 | 784 |
| 3 (Comparison) | 39 | 143 |

The moulding not produced under the conditions stated for dynamic mould-temperature control is seen not to exhibit high gloss levels. In contrast, Example 1, which used dynamic mould-temperature control (mould temperature close to Vicat softening point) exhibits the high gloss level needed for reflectors.

TABLE 3

| | Thermal expansion | |
|---|---|---|
| Example | Transverse | Longitudinal |
| Substrate material 1 | $65.2 \times 10^{-6}/K$ | $65.2 \times 10^{-6}/K$ |
| Substrate material 2 | $52.4 \times 10^{-6}/K$ | $40.9 \times 10^{-6}/K$ |
| Substrate material 3 | $49.3 \times 10^{-6}/K$ | $36.8 \times 10^{-6}/K$ |

Substrate material 2 serving for production of the multilayer structures according to the invention is seen to exhibit markedly less thermal expansion.

TABLE 4

| | Melt stability | |
|---|---|---|
| Example | MVR (330° C.; applied weight 2.2 kg); Preheat time: 6 min | IMVR (330° C.; applied weight 2.2 kg); Preheat time: 19 min |
| Substrate material 1 | 8.0 cm³/[10 min] | |
| Substrate material 2 | 2.7 cm³/[10 min] | 3.0 cm³/[10 min] |
| Substrate material 3 | 59.8 cm³/[10 min] | 67.7 cm³/[10 min] |

Surprisingly, Substrate material 2, suitable for the invention exhibits markedly high melt stability in comparison with Substrate material 3.

Overall, it has been shown that the multilayer structures according to the invention are obtained only by using the substrate material according to the invention in combination with replication in the injection-moulding process with dynamic mould-temperature control and with the specific coating process.

The invention claimed is:

1. A multilayer structure comprising
at least one substrate layer,
one metal layer bonded directly thereto, wherein the metal layer is applied in a plasma pretreatment comprising medium-frequency excitation with an air or argon-based plasma at a frequency of from 0 Hz to 10 MHz at a power rating of from 0.8 W/cm² to 8.3 W/cm², and a process gas pressure of from 0.04 to 0.15 mbar, and
at least one protective layer on the metal layer,
wherein the at least one substrate layer comprises
a copolycarbonate, which has a Vicat softening point above 160° C. in accordance with DIN ISO 306, and
an inorganic filler with lamellar geometry in an amount of from 10 to 40% by weight, based on the entirety of thermoplastics used,
wherein the inorganic filler is synthetic graphite with a smallest dimension thickness smaller than 1 μm, and is moulded in an injection-moulding process which uses dynamic mould-temperature control and the mould temperature on injection is within +/−20° C. of the Vicat softening point of the substrate material used.

2. The multilayer structure according to claim 1, wherein, based on the entire amount of the bisphenol blocks, from 15% by weight to 95% by weight, is composed of bisphenol blocks derived from 1,1-bis(4-hydroxyphenyl)-3,3,5-trimethylcyclohexane.

3. The multilayer structure according to claim 1, wherein the at least one substrate layer comprises, alongside the copolycarbonate, another thermoplastic selected from the group consisting of polysulphone, polyether sulphone, and polyetherimide.

4. The multilayer structure according to claim 1, wherein the at least one substrate layer has a thickness of from 0.1 mm to 6.0 mm, and the metal layer has a thickness of from 10 nm to 1000 nm, and also has a protective layer with a thickness in the range from 5 nm to 200 nm.

5. The multilayer structure according to claim 1, wherein the metal layer is an aluminium or silver layer.

6. The multilayer structure according to claim 1, wherein the multilayer structure also comprises a protective layer composed of one or more siloxanes with a thickness of from 5 nm to 200 nm.

7. A lamp holder, a lamp cover, a light-collector system, a light reflector, a collimator, a light-emitting diode, a metallized display, a windshield, a lens holder, an optical-waveguide element, a LED application optionally comprising a socket, a LED reflector, a heat sink, an automobile part, optionally comprising a head lamp, a bezel, an indicator, a reflector, and/or a solar reflector formed from the multilayer structure according to claim 1.

8. The multilayer structure according to claim 1, wherein, based on the entire amount of the bisphenol blocks, from 25% by weight to 90% by weight, is composed of bisphenol blocks derived from 1,1-bis(4-hydroxyphenyl)-3,3,5-trimethylcyclohexane.

9. The multilayer structure according to claim 1, wherein the inorganic filler with lamellar geometry is present in the at least one substrate layer in an amount of from 15 to 35% by weight, based on the entirety of thermoplastics used.

10. The multilayer structure according to claim 1, wherein the smallest dimension thickness of the synthetic graphite is smaller than 500 nm.

11. The multilayer structure according to claim 1, wherein the smallest dimension thickness of the synthetic graphite is smaller than 200 nm.

12. The multilayer structure according to claim 1, wherein the smallest dimension thickness of the synthetic graphite is in a range from 0.4 to 1 nm.

13. The multilayer structure according to claim 1, wherein the copolycarbonate of the at least one substrate layer comprises at least one bisphenol unit of formula (2),

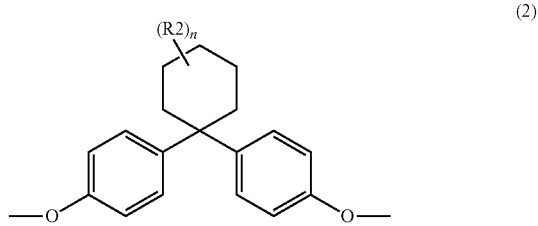

in which
R2 is C1-C4-alkyl,
n is 0,1,2 or 3,
and also comprises, as terminal group chain terminator, a structural unit of the formula (1)

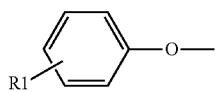 (1)

in which

R1 are hydrogen or C1-C18-alkyl.

14. The multilayer structure according to claim 13, wherein R1 is tertbutyl.

15. A process for producing a multilayer structure according to claim 1, comprising forming a base layer by injection moulding or extrusion and, in a subsequent layer.

16. The process according to claim 15, wherein the plasma pretreatment uses medium-frequency excitation with an air- or argon-based plasma at a frequency of from 0 Hz to 10 MHz at a power rating of from 0.8 W/cm$^2$ to 3.3 W/cm$^2$.

* * * * *